United States Patent
Brashnyk et al.

(10) Patent No.: US 9,845,816 B2
(45) Date of Patent: Dec. 19, 2017

(54) MAGNETICALLY ACTUATED FASTENER

(71) Applicant: Planar Systems, Inc., Beaverton, OR (US)

(72) Inventors: Neil Brashnyk, Beaverton, OR (US); Todd Loewy, Beaverton, OR (US); Eric Schuettke, Tualatin, OR (US)

(73) Assignee: Planar Systems, Inc., Beaverton, OR (US)

( * ) Notice: Subject to any disclaimer, the term of this patent is extended or adjusted under 35 U.S.C. 154(b) by 0 days.

(21) Appl. No.: 15/441,008

(22) Filed: Feb. 23, 2017

(65) Prior Publication Data

US 2017/0159876 A1    Jun. 8, 2017

Related U.S. Application Data (62) Division of application No. 14/981,495, filed on Dec. 28, 2015.
(Continued)

(51) Int. Cl.
*F16B 1/00* (2006.01)
*F16M 13/02* (2006.01)
(Continued)

(52) U.S. Cl.
CPC ............... *F16B 1/00* (2013.01); *B25B 27/14* (2013.01); *F16B 5/02* (2013.01); *F16M 13/02* (2013.01);
(Continued)

(58) Field of Classification Search
CPC ...... F16B 2001/0035; F16B 1/00; F16B 5/02; G09F 9/33; G09F 9/3026; F16M 13/02;
(Continued)

(56) References Cited

U.S. PATENT DOCUMENTS 5,533,699 A    7/1996    Nedderman, Jr.
6,559,829 B1   5/2003    Matsuo et al.
(Continued)

FOREIGN PATENT DOCUMENTS

| | | |
|---|---|---|
| AU | 2014100664 A4 | 7/2014 |
| CN | 102930786 B * | 12/2016 |
| JP | 3193153 U | 9/2014 |

OTHER PUBLICATIONS

Korean Intellectual Property Office, International Search Report and Written Opinion, International Patent Application PCT/US2015/067700, dated Apr. 19, 2016, 11 pages.

*Primary Examiner* — Eret McNichols
(74) *Attorney, Agent, or Firm* — Stoel Rives LLP (57) ABSTRACT

A mounting and leveling system for an electronic image display device (10) formed of an array of multiple display sections (12) facilitates adjustment of the alignment of adjacent display sections to minimize visible seams between display sections. Some embodiments include one or more magnetically actuated fasteners (220) that facilitate front-access-only installation and adjustment without requiring access to the rear, top, bottom, or sides of the array. Tools (300, 410) for installation and removal of display modules (50) from a front side of the display device are also disclosed. Fasteners (220) for providing a hidden adjustable connection between first and second objects are also disclosed. One such fastener includes a screw (226) having a magnetic head (222) that presents a magnetic moment perpendicular to its axis of rotation (234).

8 Claims, 7 Drawing Sheets

Related U.S. Application Data (60) Provisional application No. 62/114,021, filed on Feb. 9, 2015, provisional application No. 62/097,539, filed on Dec. 29, 2014.

(51) Int. Cl.

| | | |
|---|---|---|
| *F16B 5/02* | (2006.01) | |
| *B25B 27/14* | (2006.01) | |
| *G09F 9/302* | (2006.01) | |
| *H01F 7/02* | (2006.01) | |
| *G09F 9/33* | (2006.01) | |
| *F21V 21/34* | (2006.01) | |
| *F16K 31/08* | (2006.01) | |
| *G09G 3/30* | (2006.01) | |
| *H05K 5/00* | (2006.01) | |
| *H05K 7/14* | (2006.01) | |
| *G06F 3/14* | (2006.01) | |
| *E05B 47/00* | (2006.01) | |
| *B25B 23/12* | (2006.01) | |

(52) U.S. Cl.
CPC .......... *F16M 13/022* (2013.01); *G09F 9/3026* (2013.01); *G09F 9/33* (2013.01); *H01F 7/0252* (2013.01); *B25B 23/12* (2013.01); *E05B 47/004* (2013.01); *E05B 47/0045* (2013.01); *F16B 2001/0035* (2013.01); *F16K 31/088* (2013.01); *F21V 21/34* (2013.01); *G06F 3/1446* (2013.01); *G09G 3/30* (2013.01); *H05K 5/0021* (2013.01); *H05K 7/1427* (2013.01)

(58) Field of Classification Search
CPC ... F16M 13/022; F16K 31/088; G06F 3/1446; H05K 5/0021; H05K 7/1427; G09G 3/30; F21V 21/34; B25B 23/12; B25B 27/14; E05B 47/004; E05B 47/0045
See application file for complete search history.

(56) References Cited

U.S. PATENT DOCUMENTS

| | | | |
|---|---|---|---|
| 6,765,330 B2 | 7/2004 | Baur | |
| 7,661,621 B2* | 2/2010 | Comotto | B65H 59/22 |
| | | | 242/150 M |
| 7,727,035 B2* | 6/2010 | Rapp | H04N 5/2251 |
| | | | 439/660 |
| 7,843,295 B2 | 11/2010 | Fullerton et al. | |
| 7,843,296 B2 | 11/2010 | Fullerton et al. | |
| 7,940,150 B2 | 5/2011 | Fu et al. | |
| 7,976,177 B2* | 7/2011 | Dikopf | A47G 19/2227 |
| | | | 206/457 |
| 8,223,477 B2 | 7/2012 | Shi et al. | |
| 8,240,942 B2 | 8/2012 | Baur et al. | |
| 8,300,393 B2 | 10/2012 | Mathews | |
| 8,368,494 B2 | 2/2013 | Fiedler | |
| 8,419,334 B2* | 4/2013 | Ante | F01D 5/025 |
| | | | 411/432 |
| 8,484,873 B2 | 7/2013 | Splittgerber | |
| 8,910,804 B2 | 12/2014 | Kim et al. | |
| 9,190,198 B2* | 11/2015 | McBroom | H01F 7/0252 |
| 9,404,644 B1* | 8/2016 | Perez-Bravo | G09F 7/20 |
| 9,477,438 B1* | 10/2016 | Hochman | G09G 5/02 |
| 9,489,012 B2* | 11/2016 | Yoon | G06F 1/1601 |
| 9,612,004 B2* | 4/2017 | Hemiller et al. | F21V 21/34 |
| 2003/0056413 A1* | 3/2003 | Wiemer | G09F 7/00 |
| | | | 40/730 |
| 2005/0224682 A1 | 10/2005 | Ishizaki et al. | |
| 2006/0075666 A1 | 4/2006 | Thielemans et al. | |
| 2007/0000849 A1* | 1/2007 | Lutz | G09F 9/3026 |
| | | | 211/26 |
| 2007/0007775 A1* | 1/2007 | Gallas | E05C 19/16 |
| | | | 292/251.5 |
| 2007/0103386 A1 | 5/2007 | Hara et al. | |
| 2009/0021126 A1 | 1/2009 | Chou et al. | |
| 2010/0181456 A1 | 7/2010 | Declerck et al. | |
| 2011/0088298 A1 | 4/2011 | Pemberton | |
| 2011/0163052 A1 | 7/2011 | Kim et al. | |
| 2011/0248129 A1 | 10/2011 | Park | |
| 2012/0236509 A1 | 9/2012 | Cope et al. | |
| 2014/0003052 A1* | 1/2014 | Hemiller | G09F 9/3026 |
| | | | 362/249.02 |
| 2014/0263908 A1 | 9/2014 | Franklin | |
| 2014/0286009 A1* | 9/2014 | Hamilton | F21V 23/00 |
| | | | 362/249.02 |
| 2014/0367541 A1 | 12/2014 | Dewaele | |
| 2015/0016034 A1* | 1/2015 | Kludt | F16B 2/12 |
| | | | 361/679.01 |
| 2015/0282618 A1* | 10/2015 | Oya | H04N 5/645 |
| | | | 211/26 |
| 2015/0362160 A1* | 12/2015 | Andreasen | F21V 19/004 |
| | | | 362/97.1 |
| 2016/0010836 A1* | 1/2016 | Patterson | G09F 9/33 |
| | | | 40/541 |
| 2016/0169456 A1 | 6/2016 | Yang et al. | |
| 2016/0231976 A1* | 8/2016 | Ryu | G09G 3/30 |
| 2016/0234959 A1* | 8/2016 | Kuang | G09F 9/33 |
| 2016/0255731 A1* | 9/2016 | Ran | G09F 9/33 |
| | | | 361/807 |
| 2016/0267821 A1* | 9/2016 | Cross | A47F 3/001 |
| 2016/0307479 A1* | 10/2016 | Cox | G06F 3/01 |
| 2016/0348854 A1* | 12/2016 | Wu | G09F 13/00 |
| 2017/0006727 A1* | 1/2017 | Ryu | H01L 25/0753 |
| 2017/0034930 A1* | 2/2017 | Kludt | F16B 2/12 |
| 2017/0039021 A1* | 2/2017 | Hall | G09F 9/3023 |
| 2017/0052754 A1* | 2/2017 | Patterson et al. | G06F 3/1446 |

* cited by examiner

MAGNETICALLY ACTUATED FASTENER

RELATED APPLICATIONS

This application is a divisional of U.S. patent application Ser. No. 14/981,495, filed Dec. 28, 2015, which claims the benefit under 35 U.S.C. §119(e) of U.S. Provisional Patent Application Nos. 62/097,539, filed Dec. 29, 2014, and 62/114,021, filed Feb. 9, 2015, both of which are incorporated herein by reference.

TECHNICAL FIELD

This disclosure relates to positioning systems for arrays of electronic image display panels (e.g., direct-view LED display panels) and, in particular, to a positioning system comprising hidden magnetic fasteners operable from outside a front surface of the display panel array to adjust the position and relative alignment of the individual panels.

BACKGROUND

Known mounting and positioning systems in this field often assemble multiple display panels, or display panel sections, into a regular array for a larger display where a video or image is displayed across multiple display panel sections. Each panel or section may itself include multiple tiles, aggregated on a carrier plate to enable a regular array to cover a larger surface area with fewer iterations of the installation and adjustment process. Uniformity of an image across multiple panel sections requires an equal distance spacing between each of the light emitting components. In a direct-view light-emitting diode (DV-LED) display, the pitch of a display panel is defined as the spacing between individual LEDs, which may be anywhere from a few millimeters to a few centimeters or more. Variations in pitch appear in the image as unnaturally bright or dim spots: brightness results from spacing too close together and dimness from spacing too far apart. When placing multiple panel sections together in an array, the border between panel sections will appear as a bright line if the panel sections are spaced too close together or as a dim line if the panel sections are spaced too far apart. Such visible "seams" are undesirable in an image display.

Uniformity of the image across multiple panel sections also requires that the edges of adjacent panel sections be coplanar. If one edge is bowed out relative to the adjacent edge, the edge will appear as a bright line in the image when viewed from one oblique angle and as a dim line when viewed from another oblique angle. Bowing or bending of display panel section edges is particularly difficult to overcome where the backing of the array, which may be a wall or other frame, is itself bowed or bent or bumpy. Lack of coplanar edges creates undesirable visible seams when viewing the array from an angle.

Thus, the present inventors have recognized that achieving image uniformity requires careful positioning of the display sections so that adjacent edges are properly spaced and coplanar. Prior art mounting systems provide for some adjustment of the position of display sections, but such adjustments are tedious and often require multiple iterative adjustments of the display panel section. Typically the display section must be removed each time the mount is adjusted and then the display panel section must be replaced within the array to check the alignment. The present inventors have recognized these and other shortcomings of prior art display panel mounting systems, and a need for improved mounting systems.

SUMMARY

The system disclosed herein is designed to facilitate an installation of an array of multiple display sections to comprise a large display, for example on a wall, while minimizing the visibility of seams between display sections. The system may realize an additional advantage of achieving a front-access-only installation without requiring access to the rear, top, bottom, or sides of the array.

In another aspect of the disclosure, a device for providing a hidden adjustable connection between first and second object includes a screw having a magnetic head that presents a magnetic moment perpendicular to its axis of rotation.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
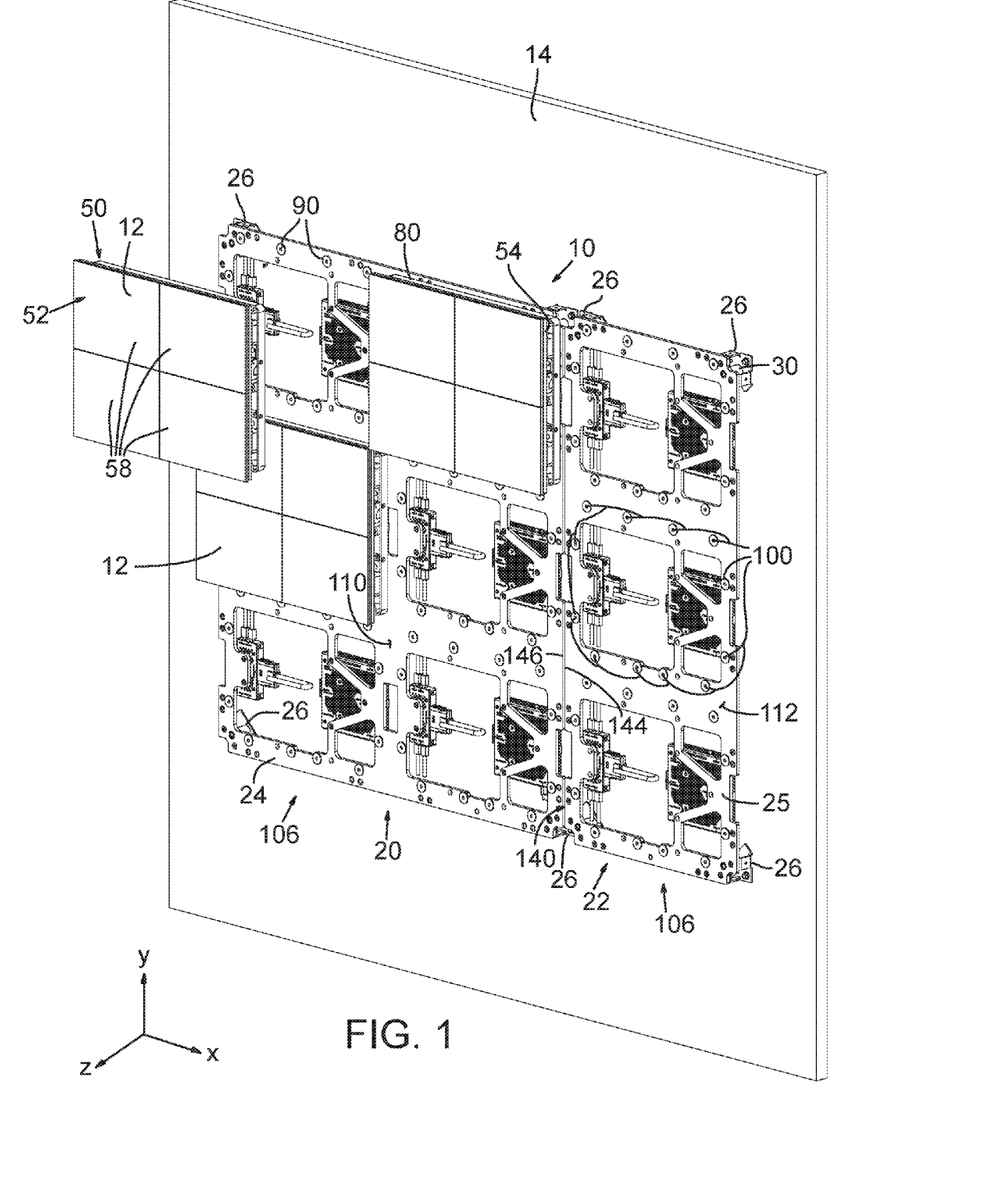
FIG. 1 is an isometric partially exploded front view of a display device including an installation of an array of display sections on a wall via a display panel mounting system according to a first embodiment.

FIG. 1 shows an installation of an electronic image display device 10 comprising a regular array of display panel sections 12. Display device 10 is secured to a wall 14 which is a form of backing and alternatively comprises a frame or open studs or other support structure. The wall 14 or other support structure is preferably flat, but may be sloped or angled or curved. Mounting plate assemblies 20 and 22 (also known as mounting brackets or mounting platforms) are fixed to wall 14. Mounting plate assemblies 20, 22 form a support platform made up of one or more support sections 24, 25. Each mounting plate assembly 20, 22 includes multiple corner mounts 26 attaching each of the support sections 24, 25 to wall 14 with screws or other fasteners.

Each corner mount 26 includes an adjustable stand-off screw 30 such as a jack screw, which adjustably connects corner mount 26 to its respective support section, such as support section 24. Rotational adjustment of stand-off screw 30 causes the connected support section 24 to move relative to wall 14, either toward wall 14 or away from wall 14 along a Z-axis. Adjustment of stand-off screw 30 moves support section 24 (or a corner thereof) along the Z-axis and causes rotation or flexing of support section 24 relative to the Z-axis. Thus, even if wall 14 has an uneven surface, adjustment of one or more stand-off screws 30 can flatten support section 24 and reduce flexing in support section 24. Stand-off screws 30 also allow the Z-position and tilt of adjacent support sections 24, 25 to be coarsely adjusted for improving relative alignment and co-planarity. In another embodiment (not shown), support sections may be designed and/or arranged to achieve a desired curvature or contoured support platform or support surface for a curved version of electronic image display device 10. For example, multiple support sections may be arranged as a series of facets of a concave or convex curve, with stand-off screws 30 allowing adjacent support sections to be adjusted to approximate a smooth curve.

An array of display panel sections 12 further includes multiple display panel modules 50 ("module"). Each module 50 includes an attached display panel section 12 which comprises a display surface 52 of module 50. Module 50 also includes a carrier 54 (see also FIG. 3), to which the display panel section 12 is attached. In the embodiment of FIG. 1, each display panel section 12 includes four separate tiles 58, each of which is fixed to carrier 54. In another embodiment (not shown), display panel section 12 may include a single tile or of any other number of tiles, such as 2, 4, 6, 8, 12, or 16 tiles, for example, generally arranged in a rectangular array, but alternatively in other shapes as described below. Module 50 also includes a base plate 80 that facilitates adjustably positionable attachment of module 50 to support section 24 by magnetic attraction, as further described below with reference to FIG. 3.

Support sections 24 and 25 provide multiple sets of magnetic elements 90, each set comprising a grouping of magnetic elements 90 corresponding to a single module 50. Each set of magnetic elements 90 is designed to interact magnetically with the base plate 80 of a single display panel module 50, in order to attach module 50 to the support section 24 or 25 with magnetic attraction. In the embodiment shown, a single set 100 of magnetic elements includes twelve discrete magnetic elements 90, but alternative sets of magnetic elements may include only one, three, four, five, six, eight, nine, ten, or any other larger number of discrete magnetic elements. Within support section 24, there are six sets 100 of magnetic elements 90, each set spaced apart from another and aligned therewith for accommodating a total of six display panel modules 50 in a rectangular, two-by-three configuration, with one module 50 attaching magnetically to each set 100 of magnetic elements. Alternatively, the present disclosure contemplates other arrangements of sets within a support section. For example, support section 25 includes three sets in a one-by-three (1×3) configuration, and other support sections may include a single set (1×1) or other rectangular configurations such as one-by-four (1×4), one-by-two (1×2), two-by-three (2×3), and two-by-four and larger. In other embodiments (not shown), display panel sections may be triangular, pentagonal, hexagonal, or other regular or irregular polygon shape. In such embodiments, the support sections are preferably shaped to accommodate whole numbers of display panel sections (of like-shaped polygons) arranged side-by-side. For example, support sections designed to accommodate triangular display panel sections may have the shape of a parallelogram (two sections), a trapezoid (three sections), hexagon (six sections) or any other regular polygon that can be formed of multiple triangles. Thus, the size and shape of the support sections and support platforms is not limited to rectangles as shown in FIG. 1 but is preferably dimensioned to provide a whole number of sets of magnetic elements and to accommodate a whole number of display panel sections.

Each support section 24 or 25 includes one or more front-facing module support surfaces 106 which is a contact surface for modules 50. Each module support surface 106 defines an X-Y plane (such definition is understood to be approximate in the situation where module support surface 106 is not perfectly flat). In the embodiment shown, the module support surface 106 includes a single set 100 of the magnetic elements 90 within an individual support section 24 or 25. In other embodiments, module support surface 106 may encompass multiple sets 100 of magnetic elements 90. In general, module support surface 106 is distinguished from the front major surfaces 110 and 112 of the respective support sections 24 and 25, in that magnetic elements 90 preferably extend beyond front major surfaces 110 and 112 in the Z-axis direction and lie in a plane to collectively provide a planar contact surface for modules 50 to attach magnetically to mounting plate assemblies 20 or 22 without modules 50 contacting front major surface 110 or 112. Thus, module support surface 106 may comprise either a single contiguous surface or a collection of surfaces of a plurality of sets 100 of magnetic elements 90 generally arranged to lie in an X-Y plane, or a combination of magnetic elements 90 and other surfaces. Module support surface 106 may in some embodiments be distinct from magnetic elements 90 in that some or all magnetic elements 90 in a set 100 may, in some embodiments, be recessed behind front major surfaces 110 and 112 in the Z-axis direction and thereby provide no contact with modules 50 even while providing sufficient magnetic attraction to attach modules 50 magnetically to mounting plate assembly 20 or 22 such that all or a portion of a front major surface (110 or 112) serves as a module support surface.

Preferably, an installation of electronic image device 10 provides that display panel sections 12 be substantially coplanar. Although modules 50 provide for some fine adjustment of the planarity of each display panel section 12, the initial positioning of support sections 24 and 25 provides the foundation for a coplanar array. Variances in planarity within or between module support surfaces 106 of support sections 24 and 25 are likely to propagate to the display panel sections 12, resulting in undesirable visible lines in images displayed on the assembled device 10. Consequently, achieving flatness within module support surfaces 106 and achieving planarity between module support surfaces 106 is important. In general, the more difficult problem is achieving planarity across a seam, such as seam 140 between module support surfaces 106 of two different support sections 24 and 25. One advantage of certain embodiments of mounting systems according to the present disclosure is that they provide for support sections 24 or 25 that each encompass multiple display panel sections 12. For example, device 10 accommodates nine display panel sections 12, but there is only one seam 140 between support sections 24 and 25. By reducing the number of seams between module support surfaces 106, this arrangement facilitates a coplanar installation of a regular array of display panel sections 12.

To improve alignment of multiple display panel sections 12 across seam 140, stand-off screws 30 can rotate a support section and its module support surfaces 106 for alignment with the X-Y plane of the module support surface(s) 106 of a different support section. Furthermore, seam 140 includes abutting edges 144 and 146 of support sections 24 and 25 respectively. Adjustable stand-off screws 30 enable independent rotation of abutting edges 144 and 146 relative to the Z-axis. This provides for vertical (Z-axis) alignment of abutting edges 144 and 146 across seam 140, which facilitates coplanar installation of display panel sections 12 across seam 140. Additionally, abutting edges 144 and 146 may be spaced a fixed distance apart at seam 140, so that the width of seam 140 is substantially unvarying along its length. Precise alignment of support sections 24, 25 and spacing therebetween at abutting edges 144 and 146 facilitates provision of an unvarying pitch between LEDs across seam 140.

Figure 2:
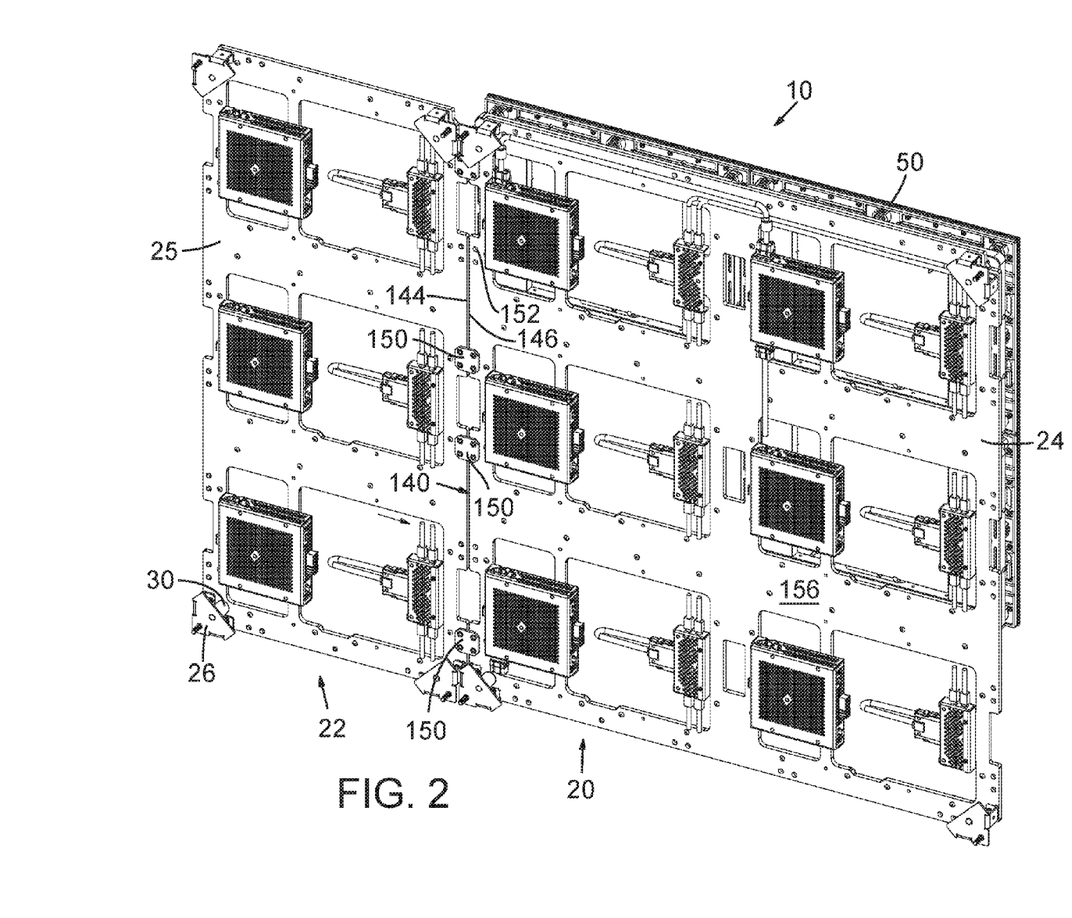
FIG. 2 is a rear isometric view of the display device of FIG. 1.

Turning to FIG. 2, illustrating a rear isometric view of the display device 10 of FIG. 1, several linking brackets 150 are attached to support sections 24 and 25 across seam 140 at predefined intervals by bolts attached through pre-positioned holes 152 in support sections 24, 25 adjacent abutting edges 144, 146. The position of pre-positioned holes 152 is designed to place support sections 24 and 25 a fixed distance apart when linking brackets 150 are attached. Each linking bracket 150 is designed to hold support sections 24, 25 in a coplanar arrangement, which facilitates coplanar arrangement of display panel tiles 12 across seam 140.

Figure 3:
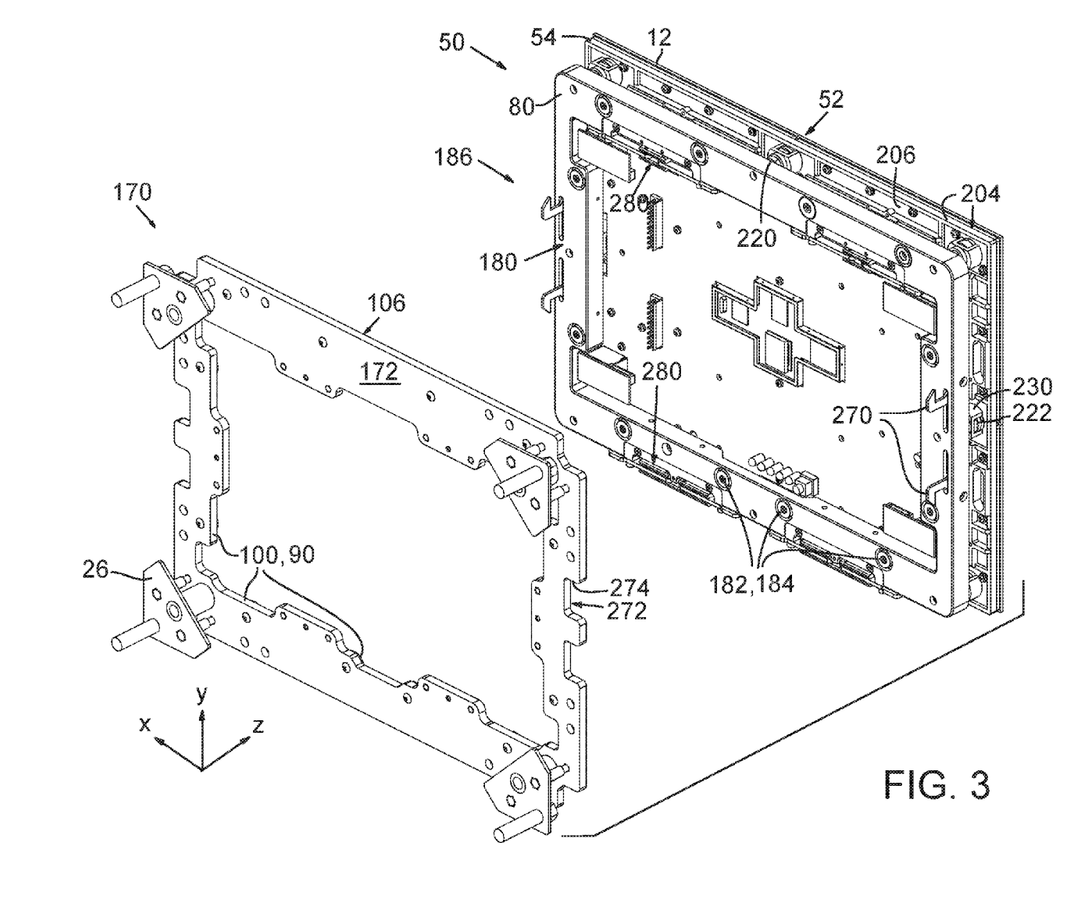
FIG. 3 is an exploded isometric view of a single 1×1 mounting plate assembly and a single display panel module.

FIG. 3 illustrates a rear isometric view of 1×1 mounting plate assembly 170 configured to support a single display panel module 50. With reference to FIG. 3, module 50 (which is shown exploded apart from mounting plate assembly 170 for clarity) includes base plate 80, carrier 54, and display panel section 12. Mounting plate assembly 170 includes corner mounts 26, magnetic elements 90, and support platform section 172 having a module support surface 106. Support platform section 172 supports one set 100 of magnetic elements 90 defining an X-Y plane, for attaching a single display panel module 50 to mounting plate assembly 170.

Base plate 80 has a rear side 180 facing module support surface 106 of support platform section 172. Rear side 180 includes a set 182 of magnetic elements 184. In the embodiment shown, set 182 includes twelve discrete magnetic elements 184, but alternative sets of magnetic elements may include only one or any number of discrete magnetic elements. Magnetic elements 184 are arranged on rear side 180 to lie in a common plane and to cooperate with set 100 of magnetic elements 90 of mounting plate assembly 170 to magnetically attract and mount base plate 80 to support platform section 172. Set 182 of magnetic elements 184 cooperate to form a rear surface 186 of module 50, which is which is a contact surface for support platform section 172. When module 50 is mounted to support platform section 172, rear surface 186 contacts module support surface 106 and in combination with module support surface 106 creates an interface that enables sliding of module 50 relative to support platform section 172. The sliding interface allows an X-Y position of base plate 80 to be adjusted by manually sliding base plate 80 along the X-Y plane defined by module support surface 106. Adjustment of an X-Y position of base plate 80 includes translation along the X-axis, Y-axis, or both, as well as rotation in the X-Y plane. In the embodiment shown, rear surface 186 is flat, but alternative embodiments may provide a somewhat bumpy, rough, or other discontinuous surface. The amount of sliding of base plate 80 relative to support platform section 172 is limited by the size of magnetic elements 90 and magnetic elements 184. If no portion of a magnetic element 184 is positioned in front (along the Z-axis) of a magnetic element 90, the magnetic attraction between set 182 and set 100 is not sufficient to support the weight of module 50. Consequently, module 50 should preferably not be allowed to slide in any direction into a position where no portion of a magnetic element 184 is positioned in front of a portion of a magnetic element 90. Alternative embodiments may provide for a greater range of sliding adjustment of module 50 in the X-Y plane by increasing the size of magnetic elements 90 or 184 or both. In some embodiments (not illustrated), a fine X-Y adjustment device, such as a pair of screw adjusters, may be interposed between module 50 and support platform section 172. One advantage of adjusting the X-Y position of base plate 80 is to facilitate positioning of adjacent display panel sections 12 without gaps therebetween that would otherwise disrupt the LED pitch across a regular array of display panel sections 12 and cause undesirable visible bright or dark lines in the displayed image.

Preferably, magnetic elements 90 and 184 are permanent magnets, and more preferably a steel-encased permanent magnet (also known as a "pot magnet") which focuses the magnetic field and shunts the magnetic flux when an air gap is formed between the pot magnet and another magnetic element. Alternatively, magnetic elements may include electromagnets. In some embodiments, a first sets of magnetic elements (e.g. set 100 of magnetic elements 90) is made up of permanent magnets or electromagnets, while the other set of magnetic elements (e.g. set 182 of magnetic elements 184) consists essentially of a magnetic material such as steel, which is attracted to the permanent magnets of the first set. In some embodiments the magnetic elements may be integrally part of the support platform section 172 or the base plate 80. For example, the support platform section could be made of a magnetic material such as steel.

Carrier 54 has an outer face 204 attached to display panel section 12. Outer face 204 is the same size or smaller than display surface 52. This configuration enables adjacent display panel sections 12 to abut one another directly and thereby to prevent gaps between display panel sections 12 that would interrupt the even pitch of LEDs across an array of display panel sections 12 and cause undesirable visible lines in the resulting image. Thus, no part of carrier 54 extends beyond the periphery of display panel section 12.

Opposite outer face 204, Carrier 54 also has a rear face 206 that faces base plate 80. For attaching carrier 54 to base plate 80, one or more adjustable fasteners 220 protrude through the rear surface 206. In the embodiment shown, adjustable fasteners 220 are threaded fasteners, such as a type of screw described below with reference to FIG. 7 with a shank protruding through or from rear surface 206, but alternatively may include cams, chains, flexible belts or other means of adjustable attachment. Adjustable fasteners 220 each include a magnetic component, such as magnetic head 222, movably mounted to carrier 54 behind outer face 204. An upper surface 226 of magnetic head 222 is recessed rearward of outer face 204 so that display panel section 12 lies flat against outer face 204. Carrier 54 preferably accommodates each magnetic head 222 within a pocket 230 or cavity, which provides space that accommodates movement of magnetic head 222 when adjustable fastener 220 is being adjusted as described below with reference to FIG. 7. Carrier 54 preferably includes a set of pockets 230 or cavities spaced apart around a periphery of carrier 54. Pocket 230 is not essential to the operation of carrier 54 but may be substituted with or formed by alternatives, such as an open collar 240 (illustrated in the embodiment of FIG. 7) or other bracket or attachment structure, which may or may not define a cavity or pocket 230 containing magnetic head 222. In one embodiment, carrier 54 includes five pockets 230 or cavities supporting five adjustable fasteners 220, including one on each corner of the carrier 54 and one midway along the long edge of the carrier 54. The placement of adjustable fasteners desirably allows for adjustment of the pitch (rotational orientation of carrier 54 about the X-axis), yaw (rotational orientation of carrier 54 about the Y-axis), and the bow (flexure) of carrier 54. In other embodiments, a greater or lesser number of adjustable fasteners 220 may be employed for each module 50.

Base plate 80 includes one or more safety latches 270. When module 50 is attached to support platform section 172, each safety latch 270 extends through a latch receiver 272 in support platform section 172 and extends around a catch 274. Safety latches 270 are designed to remain in an extended (latched) position unless retracted and thus prevent module 50 from inadvertently falling or being dropped, for example during installation or servicing, or in the unlikely event that the magnetic attraction between magnetic elements 90 and 184 weakens or fails. Base plate 80 includes one or more eject mechanisms 280, described below with reference to FIG. 4, which can be selectively actuated to remove module 50 from mounting plate assembly 170 by forcing a separation between magnetic elements 90 and 184.

Figure 4:
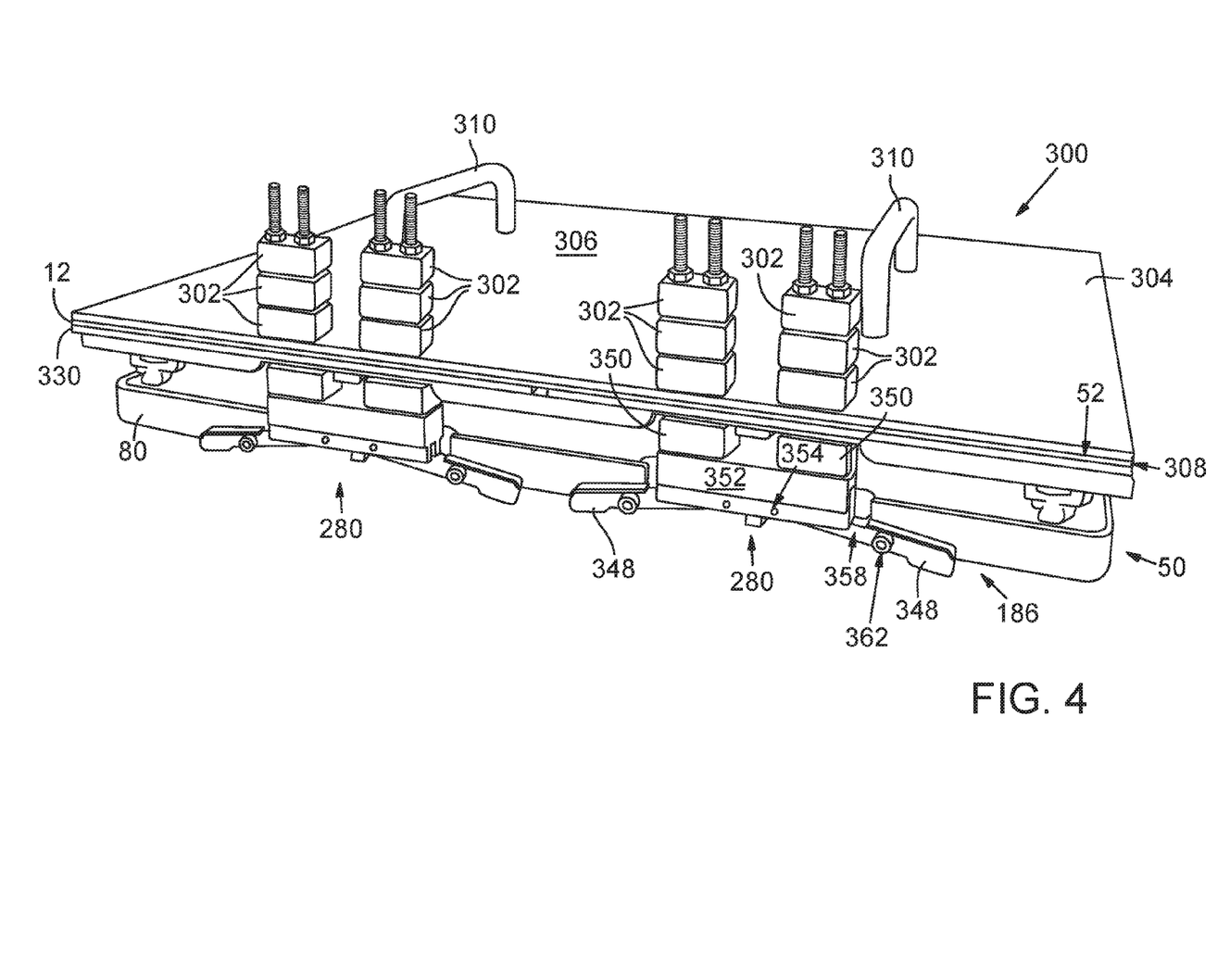
FIG. 4 is one embodiment of an installation/removal tool attached to a display panel module, with an eject mechanism of the display panel module shown in an activated state.

FIG. 4 is a perspective view of an installation tool or removal tool 300 attached to module 50, illustrating ejection magnets 302 of tool 300 holding eject mechanisms 280 in an activated state. Tool 300 includes a flexible pad 304 having an upper surface 306 and a lower surface 308. When tool 300 attaches to module 50, lower surface 308 faces and contacts display surface 52. One or more handles 310 are affixed to upper surface 306 of tool 300 for lifting tool 300 and the attached module 50.

Display panel section 12 includes multiple tiles 58 and a heat sink 330 for each tile. When operating as part of electronic image device 10, each tile 58 produces heat. In the embodiment illustrated in FIG. 4, heat sinks 330 are sandwiched between tiles 58 and carrier 54, and transfer heat away from tiles 58 and into carrier 54. In other embodiments (not illustrated), however, heat sinks 330 may be omitted and tiles 58 may be installed directly on carrier 54 such that carrier 54 serves as the primary heat sink.

Eject mechanism 280 includes bearing surfaces 348, for pushing against a support platform (such as support platform section 172 of FIG. 3 or support sections 24, 25 of FIG. 1) when module 50 is attached by magnetic attraction to a support platform. FIG. 4 shows eject mechanism 280 in an activated state, wherein bearing surfaces 348 extend beyond rear surface 186 of base plate 80 for contacting a support platform. Eject mechanism 280 is activated magnetically from the opposite of display panel section 12. When tool 300 is attached to module 50, ejection magnets 302 are positioned in front of display panel section 12 opposite each of several magnetic elements 350 of eject mechanism 280, which are located behind display panel section 12. Magnetic elements 350 are movably attached to base plate 80 via breaker arms 358 of eject mechanism 280. A pin or other link 354 pivotably secures breaker arms 358 to a traveler block 352 of eject mechanism 280 which is slidably attached to base plate 80. A pivot 362 rotatably secures a middle section of each breaker arm 358 to the periphery of base plate 80. Preferably, each breaker arm 358 attaches to traveler block 352 at one end of breaker arm 358, in order to maximize the bearing force at bearing surfaces 348 created by the magnetic attraction between ejection magnets 302 and magnetic elements 350. The magnetic attraction between ejection magnets 302 and magnetic elements 350 translates through breaker arm 358 into a mechanical bearing force between bearing surface 348 and the support platform to which module 50 is attached (such as support platform section 172 in FIG. 3). The tool 300 and ejection magnets 302 enable operation of the eject mechanism 280 on a display panel section 12 from the front only, without requiring access behind display panel section 12. Thus, placing tool 300 adjacent display surface 52 both activates eject mechanism 280 and magnetically attracts module 50 to installation tool so that module 50 can be lifted and carried using handles 310. Removal of tool 300 from module 50 occurs by flexing an edge or a corner of the flexible pad 304 upward, away from display surface 52, in order to break the magnetic attraction between flexible pad 304 and module 50.

Figure 5:
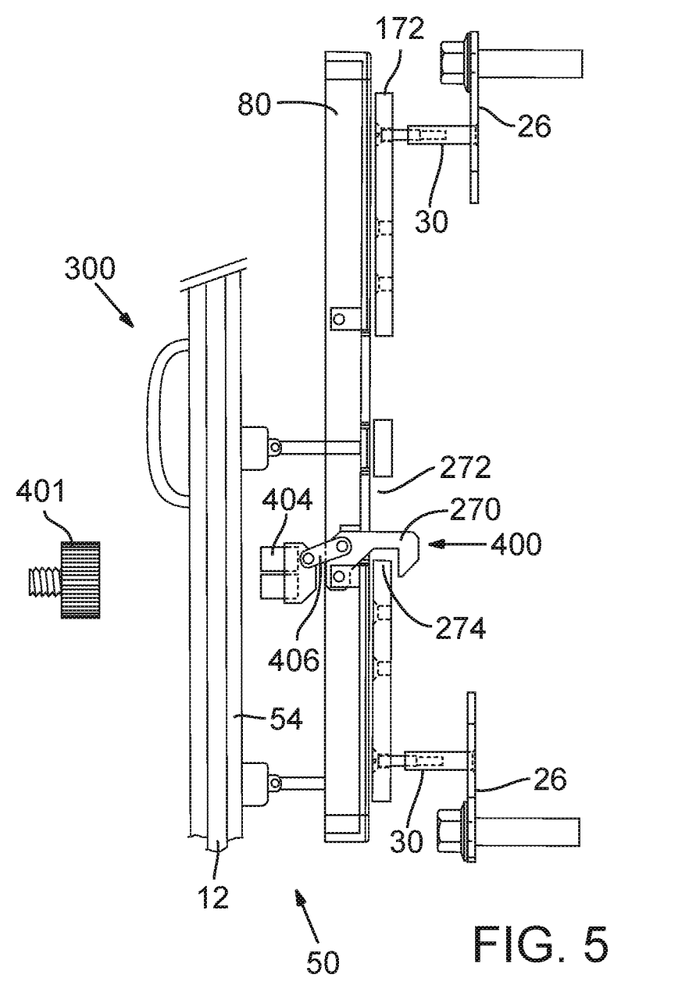
FIG. 5 is a cross section view of a base plate of the display panel module of FIG. 3 attached to a support platform with a latch of the base plate shown engaged, and including a schematic illustration of a display panel section and the installation/removal tool of FIG. 4.

FIG. 5 shows a cross section of base plate 80 attached to support platform section 172, with carrier 54, display panel 12, and tool 300 illustrated schematically. A latch mechanism 400 includes safety latch 270, which is shown in an engaged position extending through latch receiver 272 and around catch 274 of support platform section 172. Removal of module 50 from support platform section 172 using tool 300 requires disengagement of safety latch 270. To actuate safety latch 270 and thereby disengage safety latch 270 from support platform section 172, an actuating magnet 402 is positioned outside display panel section 12. When actuating magnet 402 is positioned opposite safety latch 270 on the front side of display panel 12, actuating magnet 402 attracts a magnetic element 404 connected to safety latch 270 by a linkage 406. As actuating magnet 402 draws magnetic element 404 forward toward display panel section 12, linkage 406 pulls safety latch 270 away from catch 274 so that safety latch 270 cannot inhibit separation of base plate 80 from support platform section 172. A manual transmission may control the position of actuating magnet 402 relative to the rest of tool 300 to selectively and controllably release safety latch 270.

Figure 6:
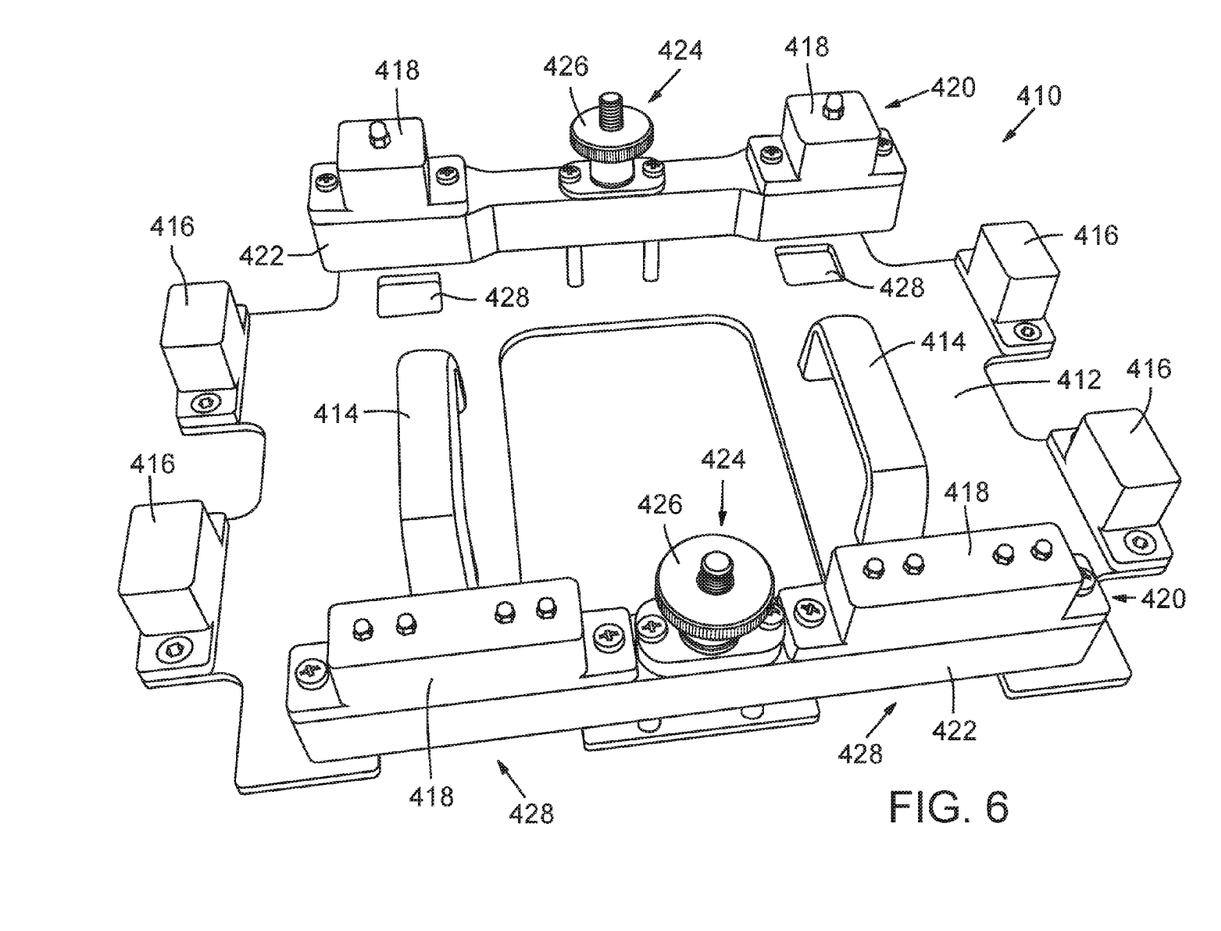
FIG. 6 is a perspective view of an installation/removal tool according to another embodiment

FIG. 6 is a perspective view of an installation/removal tool 410 according to another embodiment. With reference to FIG. 6, tool 410 includes a lifting platform 412, which is preferably made of a plate of nonmagnetic metal, such as aluminum, or of another rigid nonmagnetic material, instead of a flexible pad. A pair of lifting handles 414 are attached to a face of lifting platform 412. Several sets of latch release magnets 416 are fixedly supported on metal plate 412 to actuate and release the safety latches 270 (FIG. 3) when tool 410 is placed adjacent display surface 52 of module 50. Several sets of ejection actuator magnets 418 are supported on ejector control mechanisms 420, each comprising a traveler 422 mounted to platform 412 by means of one or more screw adjusters 424 with thumb wheels 426 attached to traveler 422 to controllably drive and position ejection actuator magnets 418 toward or away from platform 412 and module 50 (not shown). Thus, ejector control mechanisms 420 selectively and controllably actuate or release the ejector mechanism 280 (FIGS. 3-4) of module 50. Platform 412 may include a series of windows or apertures 428 aligned with magnets 416, 418 to allow magnetic flux to pass through.

Screw adjusters 424 and thumb wheels 426 reduce or avoid violent forces that can otherwise occur during installation and removal of module 50 due to the attractive magnetic forces between ejection actuator magnets 418 and magnetic elements 35 (or the sudden decline thereof during release), and the engagement of attractive magnetic forces between magnetic elements 90 and magnetic elements 184 (or the release thereof). For example, the attractive magnetic force between magnetic elements 90 and magnetic elements 184 may exceed 70 pounds of force, so a slow and controlled movement of ejection actuator magnets 418 allows tool 410 to smoothly mount or disengage module 50 to or from its mounting plate assembly.

Figure 7:
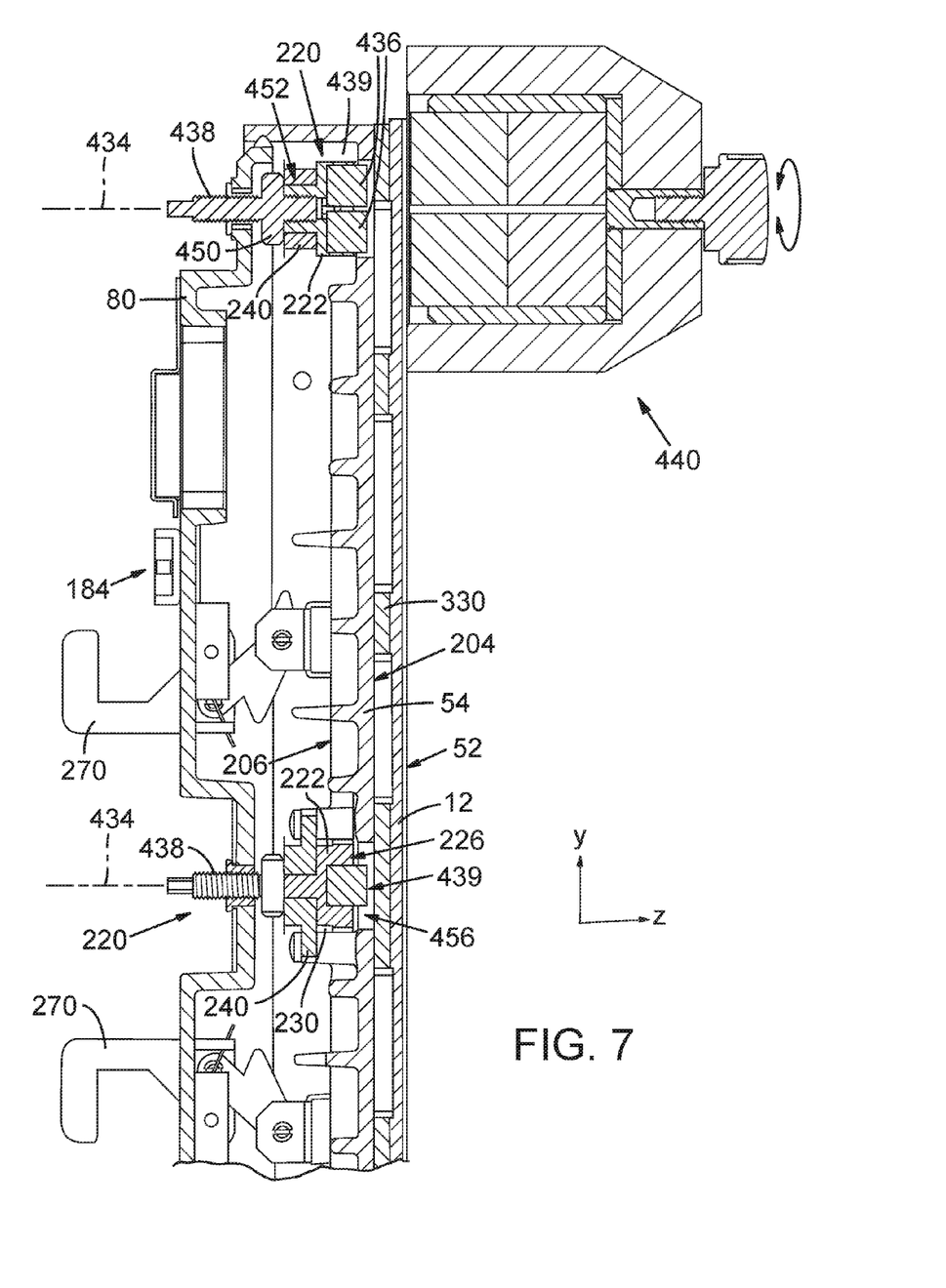
FIG. 7 is an enlarged cross section view of the display panel module of FIG. 3 with the mounting plate assembly omitted, and illustrating an adjustment screw of the display panel module together with a magnetic driver tool for adjusting the adjustment screw.

FIG. 7 shows a cross section of adjustable fastener 220. Adjustment of one or more adjustable fasteners 220 adjusts the distance between carrier 54 and base plate 80 in the Z-direction, along an axis 434 of the adjustable fastener 220. In the embodiment shown, adjustable fastener 220 includes a threaded stem or shank 438 attached to and extending from magnetic head 222 along axis 434. The upper surface 226 of magnetic head 222 faces away from shank 438. The shank 438 operably engages base plate 80 via a threaded connection to adjust a distance between carrier 54 and base plate 80 when adjustable fastener 220 and its magnetic head 222 are rotated. In other embodiments (not shown), the connection between adjustable fastener 220 and base plate 80 may be by other than a threaded connection, such as a cam or other mechanical transmission responsive to movement of magnetic head 222. Adjustable fastener 220 preferably includes a magnetic component 439, which may be a pair of rare-earth magnets 436 fitted into first and second recesses in the upper surface 226 of head 222 and presenting two opposing magnetic poles having a magnetic moment vector perpendicular to axis 434.

Rotational force is applied to adjustable fastener 220 from outside the display panel section 12 by a driver 440, held opposite the adjustable fastener 220 so as to apply a magnetic field vector perpendicular to axis 434 of adjustable fastener 220. Misalignment of the magnetic field vector of driver 440 and the magnetic moment vector of magnetic component 439 imparts a rotational force to adjustable fastener 220 around axis 434. Adjustment of one or more adjustable fasteners 220 occurs by holding driver 440 in front of display surface 52 in proximity to display surface 52 and rotating driver 440 around axis 434 to create a time-varying magnetic field (rotating magnetic field). Such adjustment adjusts the distance between carrier 54 and base plate 80 in the Z-direction to achieve tilting or flexing of the plane of display surface 52. Module support surface 106 of support platform section 172 defines an X-Y plane, out of which a Z-axis extends normal to the plane. Adjustments to adjustable fasteners 220 move carrier 54 along the Z-axis and also change the angle between display surface 52 and the Z-axis. Thus, even if adjacent base plates 80 are not coplanar with each other, adjustment of one or more adjustable fasteners 220 can level display panel section 12 or allow for fine adjustment of forward-rearward positioning and tilt of adjacent display panel sections 12 for improving relative alignment and co-planarity. Thus, each of magnetic components 439 is movable in response to application of a magnetic field adjacent to display surface 52 of display panel section 12 to adjust the distance between carrier 54 and base plate 80 thereby leveling display panel section 12 relative to adjacent display panel sections 12 without removing the carrier or manipulating the mounting system from the rear.

In the embodiment shown, threaded shank 438 is a double-ended screw with a shoulder 450 that extends radially outward from the shank 438. Shank 438 is threaded into a socket on the underside of head 222 to define a fixed size gap between shoulder 450 and head 222 forming a circumferential channel 452 around threaded shank 438. The combination of the threaded shank 438 and the head 222 forms a screw 456 of the adjustable fastener 220. Channel 452 is sized only slightly wider than the thickness of carrier 54 at the place where threaded shank 438 protrudes through rear face 206, which allows shank to rotate therein. In one embodiment, illustrated in FIG. 7, rear face 206 includes a collar 240 affixed or fastened to carrier 54 to form a pocket or cavity 230 within which the magnetic head 222 is captured. Collar 240 is captured in the circumferential channel 452 formed by the joinder of shank 438 to head 222 so that collar 240 forms a bearing surface for rotation of the screw 456 of adjustable fastener 220.

Among other benefits, the arrangement of adjustable fastener 220 with channel 452 retaining the shank 438 to carrier 54 prevents movement of carrier 54 relative to base plate 80 along the Z axis and in the X-Y plane unless an adjustment is made to one or more adjustable fasteners 220.

Accordingly, adjustable fastener 220 comprises a device for providing a hidden connection between a first object, such as carrier 54, and a second object, such as base plate 80. The adjustable fastener 220 may comprise a screw 456 (as illustrated in FIG. 7) having a threaded shank 438 with axis 434 and defining a circumferential channel (such as channel 452) and a head 222 attached to shank 438. A collar 240 is attachable to the first object and seated within channel 452 so that the screw 456 is rotatably attached to the first object and hidden beneath an outer surface of the first object (such as outer face 204 of carrier 54) with the head 222 proximal the outer surface of the first object. Collar 240 and channel 452 are sized to permit the screw to rotate relative to the first object while preventing movement of the first object along the axis 434 relative to the screw 456. The threaded shank 438 is threadably connected to the second object by way of a threaded bore in the second object, such that the connection between the first and second objects is adjusted in response to application of a rotating or otherwise time-varying magnetic field adjacent the outer surface of the first object.

It will be obvious to those having skill in the art that many changes may be made to the details of the above-described embodiments without departing from the underlying principles of the invention. The scope of the present invention should, therefore, be determined only by the following claims.

The invention claimed is:

1. A device for providing a hidden adjustable connection between a first object and a second object, comprising
    a screw including:
        a threaded shank having an axis and defining a circumferential channel, and
        a head attached to the shank and including an upper surface facing away from the threaded shank, the upper surface presenting two opposing magnetic poles having a first magnetic moment perpendicular to the axis,
        the screw attachable to the first object via the channel so that the screw is hidden beneath an outer surface of the first object with the head proximal of the outer surface and so that the screw is rotatable relative to the first object while preventing movement of the first object along the axis relative to the screw, the threaded shank being threadably connected to the second object such that the connection between the first and second objects is adjusted in response to application of a time-varying magnetic field adjacent the outer surface of the first object.

2. The device of claim 1, wherein the channel is formed between the head and a shoulder extending radially outward from the shank, the shoulder spaced apart from the head.

3. The device of claim 1, wherein the two opposing magnetic poles are created by first and second permanent magnets fitted into first and second recesses formed in the upper surface of the head.

4. The device of claim 1, wherein the threaded connection between the threaded shank and the second object is by way of a threaded bore.

5. The device of claim 1, further comprising an actuator tool for applying an actuating magnetic field adjacent the outer surface of the object, wherein the actuating magnetic field has a magnetic moment perpendicular to the axis and is rotatable about the axis to drive the screw.

6. The device of claim 1, wherein the threaded shank is a double-ended screw with a shoulder, one end of the double-ended screw is threaded into a socket on the underside of the head opposite the upper surface, and the circumferential channel is formed between the shoulder and the head.

7. The device of claim 1, wherein the first object includes a collar captured in the circumferential channel.

8. The device of claim 1, wherein a distance between the first and second objects is adjusted in response to the application of a time-varying magnetic field adjacent the outer surface of the first object.

* * * * *